United States Patent
Meda et al.

(10) Patent No.: US 6,683,714 B1
(45) Date of Patent: Jan. 27, 2004

(54) BIREFRINGENCE MINIMIZING FLUORIDE CRYSTAL OPTICAL VUV MICROLITHOGRAPHY LENS ELEMENTS AND OPTICAL BLANKS

(75) Inventors: Gautam Meda, Corning, NY (US); Michael Rivera, Columbia, MD (US); Michael W. Price, Big Flats, NY (US)

(73) Assignee: Corning Incorporated, Corning, NY (US)

(*) Notice: Subject to any disclaimer, the term of this patent is extended or adjusted under 35 U.S.C. 154(b) by 7 days.

(21) Appl. No.: 09/980,670

(22) PCT Filed: Jun. 22, 2000

(86) PCT No.: PCT/US00/17165
§ 371 (c)(1),
(2), (4) Date: Oct. 31, 2001

(87) PCT Pub. No.: WO01/01182
PCT Pub. Date: Jan. 4, 2001

Related U.S. Application Data

(60) Provisional application No. 60/141,155, filed on Jun. 25, 1999.

(51) Int. Cl.$^7$ .......................... G02B 13/14; C03C 10/16
(52) U.S. Cl. .................. 359/355; 359/350; 359/642; 117/940; 501/3
(58) Field of Search ................. 359/350, 352, 359/355, 356, 7, 652, 654, 642; 117/940; 501/3

(56) References Cited

U.S. PATENT DOCUMENTS

| | | | |
|---|---|---|---|
| 5,031,977 A | 7/1991 | Gibson | 350/1.4 |
| 6,061,174 A | 5/2000 | Shiozawa et al. | 359/361 |
| 6,201,634 B1 | 3/2001 | Sakuma et al. | 359/322 |

OTHER PUBLICATIONS

Optovac Crystal Handbook, Optovac, E. Brookfield Road, N. Brookfield, MA 01535.

*Primary Examiner*—Mark A. Robinson
*Assistant Examiner*—Lee Fineman
(74) *Attorney, Agent, or Firm*—Walter M. Douglas; Edward F. Murphy

(57) ABSTRACT

A birefringence minimizing fluoride crystal vacuum ultraviolet ("VUV") optical lithography lens element is provided for use with lithography wavelengths<230 nm. The VUV lithography lens element has an optical axis encompassed by a lens perimeter with the fluoride crystal lens having a variation in crystallographic orientation direction which tilts away from the optical center axis towards the lens perimeter to provide minimal birefringence. The invention includes a birefringence minimizing fluoride crystal optical lithography lens blank with a variation in crystallographic orientation direction across the blank.

23 Claims, 20 Drawing Sheets

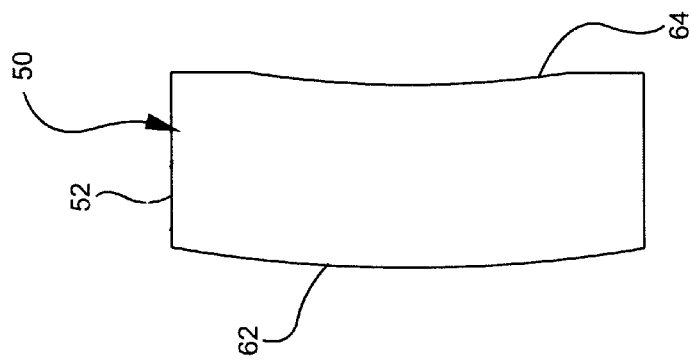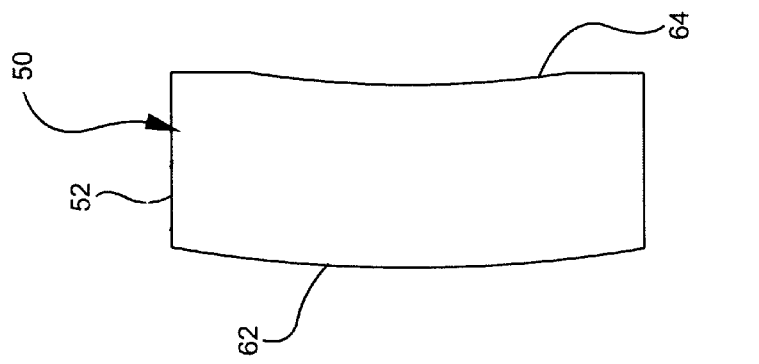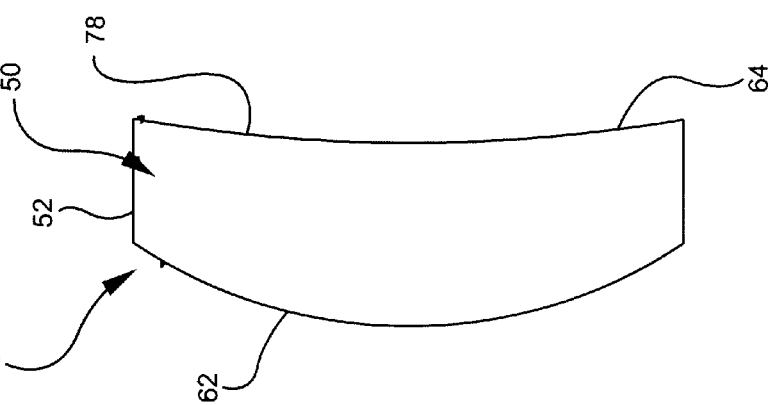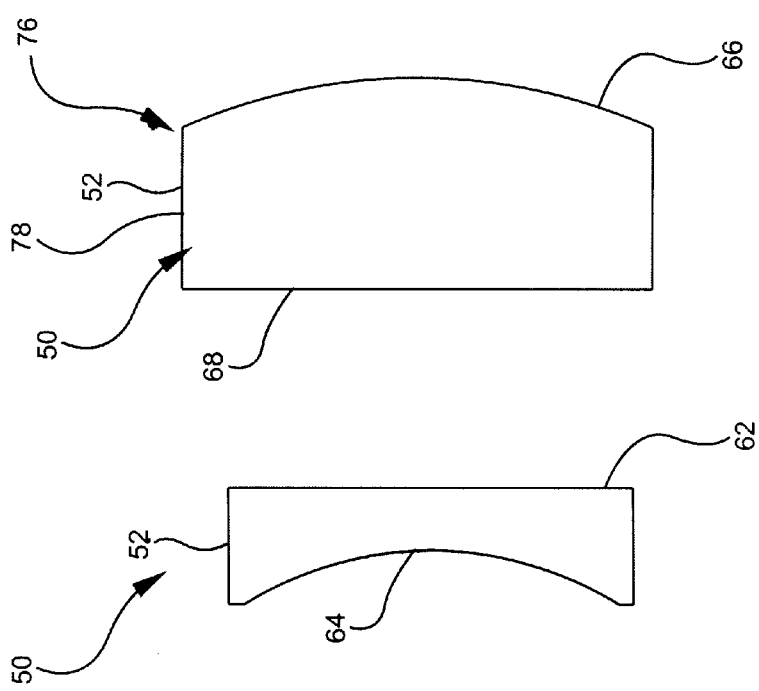

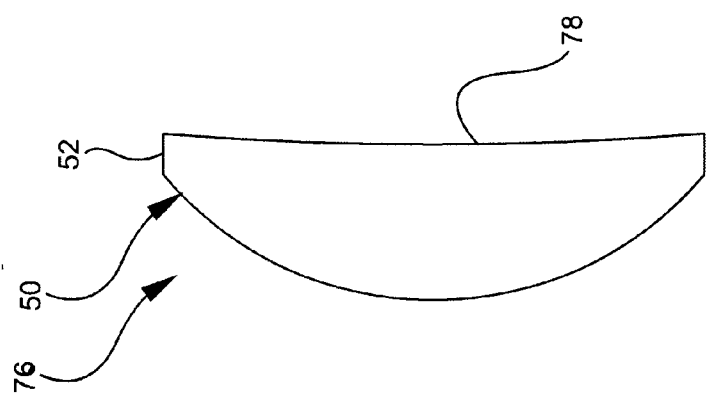
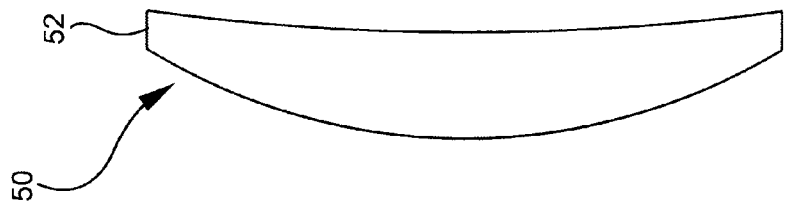
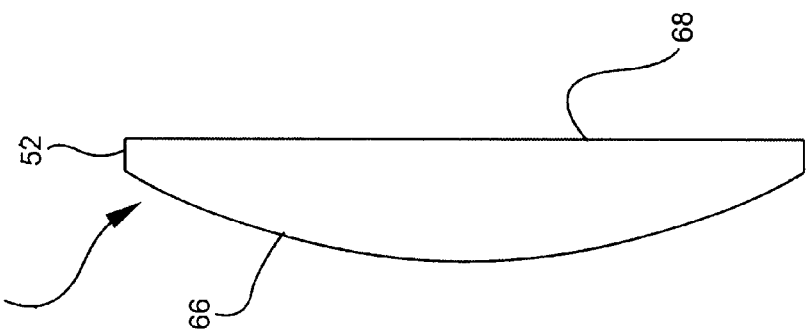

BIREFRINGENCE MINIMIZING FLUORIDE CRYSTAL OPTICAL VUV MICROLITHOGRAPHY LENS ELEMENTS AND OPTICAL BLANKS

CROSS-REFERENCE TO RELATED APPLICATION

This application claims the benefit of U.S. Provisional Application Ser. No. 60/141,155, filed Jun. 25, 1999, entitled Minimal Birefringence By Orientation Control, of Gautam Meda, Michael W. Price and Michael Rivera, the content of which is relied upon and incorporated herein by reference and the benefit of priority under 35 U.S.C. §120 is hereby claimed.

BACKGROUND OF THE INVENTION

Field of the Invention

The present invention relates generally to optical lithography elements and blanks, and particularly to optical microlithography crystal lens elements and optical element blanks for use in optical photolithography systems utilizing vacuum ultraviolet light (VUV) wavelengths below 200 nm, preferably below 193 nm, preferably below 175 nm, more preferably below 164 nm, such as VUV projection lithography systems utilizing wavelengths in the 157 nm region.

Projection optical photolithography systems that utilize the vacuum ultraviolet wavelengths of light below 200 nm provide benefits in terms of achieving smaller feature dimensions. Such systems that utilize vacuum ultraviolet wavelengths in the 157 nm wavelength region have the potential of improving integrated circuits with smaller feature sizes. Current optical lithography systems used by the semiconductor industry in the manufacture of integrated circuits have progressed towards shorter wavelengths of light, such as the popular 248 nm wavelengths, but the commercial use and adoption of vacuum ultraviolet wavelengths below 200 nm, such as 193 and 157 nm has been hindered by the transmission nature of such vacuum ultraviolet wavelengths in these VUV excimer laser regions through optical materials. Available optical materials and their optical properties at such short lithography wavelengths have hindered the industrial utilization of the below 200 nm wavelengths in optical lithography systems. The utilization of fluoride crystals such as calcium fluoride as optical lens blanks for and optical lens elements in optical lithography has been hindered by the birefringence of the fluoride crystal optical materials and the detrimental effect that the crystal's birefringence has on the lithography light transmitted though it. For the benefit of vacuum ultraviolet photolithography in the below 200 nm wavelength 157 nm region such as the emission spectrum VUV window of a $F_2$ excimer laser to be utilized by the semiconductor industry in the manufacturing of integrated circuits there is a need for optical lithography fluoride crystal lens element members and optical member blanks with minimal birefringence.

European Patent Application EP 1001314A2 of the Nikon Corporation describes a durable optical system for projection exposure which utilizes calcium fluoride crystals for their superior durability against high irradiating lithography energy densities such as produced by a ArF excimer lithography laser. U.S. Pat. No. 6,061,174 of the Nikon Corporation describes a lithography image focusing optical system for ultraviolet lasers with shorter than 300 nm wavelengths which utilizes image focusing calcium fluoride crystal optical members with low sodium concentrations. Such systems have utilized calcium fluoride crystal lens elements with uniform <111> crystallographic orientation direction as shown in FIG. 4 herein. The prior art has not addressed the adaption of the fluoride crystal element to the lithography light beam it is manipulating.

The present invention overcomes problems in the prior art and provides beneficial lithography elements with beneficial optical properties and lithography characteristics including minimal birefringence and blanks therefor that can be used to improve the lithographic manufacturing of integrated circuits with VUV wavelengths.

SUMMARY

An embodiment of the invention comprises a birefringence minimizing fluoride crystal VUV optical lithography lens. The lens is preferably comprised of a single fluoride crystal. The fluoride crystal lens has an optical center axis encompassed by a fluoride crystal lens perimeter with the lens having a variation in crystallographic orientation direction which tilts away from an optical center axis <111> direction orientation and towards the perimeter.

In further embodiment the invention includes a fluoride crystal optical lens. The fluoride crystal optical lens is comprised of a single fluoride crystal having a first optical lens surface and a second optical lens surface which opposes the first lens surface. The fluoride crystal has a progressive concentration of crystal dislocation defects that increases from the first optical lens surface to the second optical lens surface.

A further embodiment of the invention includes a calcium fluoride crystal optical element for manipulating a transmitting wavelength $\lambda$<200 nm. The calcium fluoride crystal optical element comprises a calcium fluoride crystal having a first optical surface and a second optical surface for manipulating the wavelength $\lambda$ light. The calcium fluoride crystal has a concentration of crystal dislocation defects that increases from the second optical surface to the first optical surface. The first optical surface has a first surface subgrain boundary length per unit area in the range from about 10 to 50 cm/cm². The second optical surface has a second surface subgrain boundary length per unit area <10 cm/cm².

An embodiment of the invention includes a fluoride crystal lens blank comprising a fluoride crystal having a center axis through a large dimension D surface. The center axis and the large dimension D surface are encompassed by a blank perimeter. The center axis aligns and coincides with an optically preferred crystallographic direction of the fluoride crystal. The fluoride crystal lens blank has a variation in crystallographic orientation direction which spreads out from the center axis and tilts away from the center axis and towards the blank perimeter.

A further embodiment of the invention includes a birefringence minimizing fluoride crystal optical lithography lens blank. The blank comprises a calcium fluoride crystal having a 193 nm internal transmission >99%/cm, a 157 nm internal transmission >99%/cm and a refractive index homogeneity no greater than 1 ppm. The calcium fluoride crystal has a plurality of non-parallel crystallographic <111> orientation and the blank has a center axis which coincides with a calcium fluoride crystal <111>. The blank has a crystal perimeter and a variation in crystallographic orientation direction wherein the angular deviation between the center axis and a given non-parallel crystallographic <111> orientation having a relative location between said center axis and the perimeter correlates to the relative location distance from the center axis. Preferably the angular deviation increases with an increase in distance from the center axis.

Another embodiment of the invention includes a fluoride crystal optical element blank. The optical element blank is comprised of a fluoride crystal having a diameter, a first diameter plane surface, a second diameter plane surface, and a crystal thickness defined by the first and second surfaces. The blank lens has a concentration of crystal dislocation defects that increases from the second surface to the first surface. The second surface has a second surface subgrain boundary length per unit area SS and the first surface has a first surface subgrain boundary length per unit area F S wherein FS>SS.

DETAILED DESCRIPTION

Figure 1:
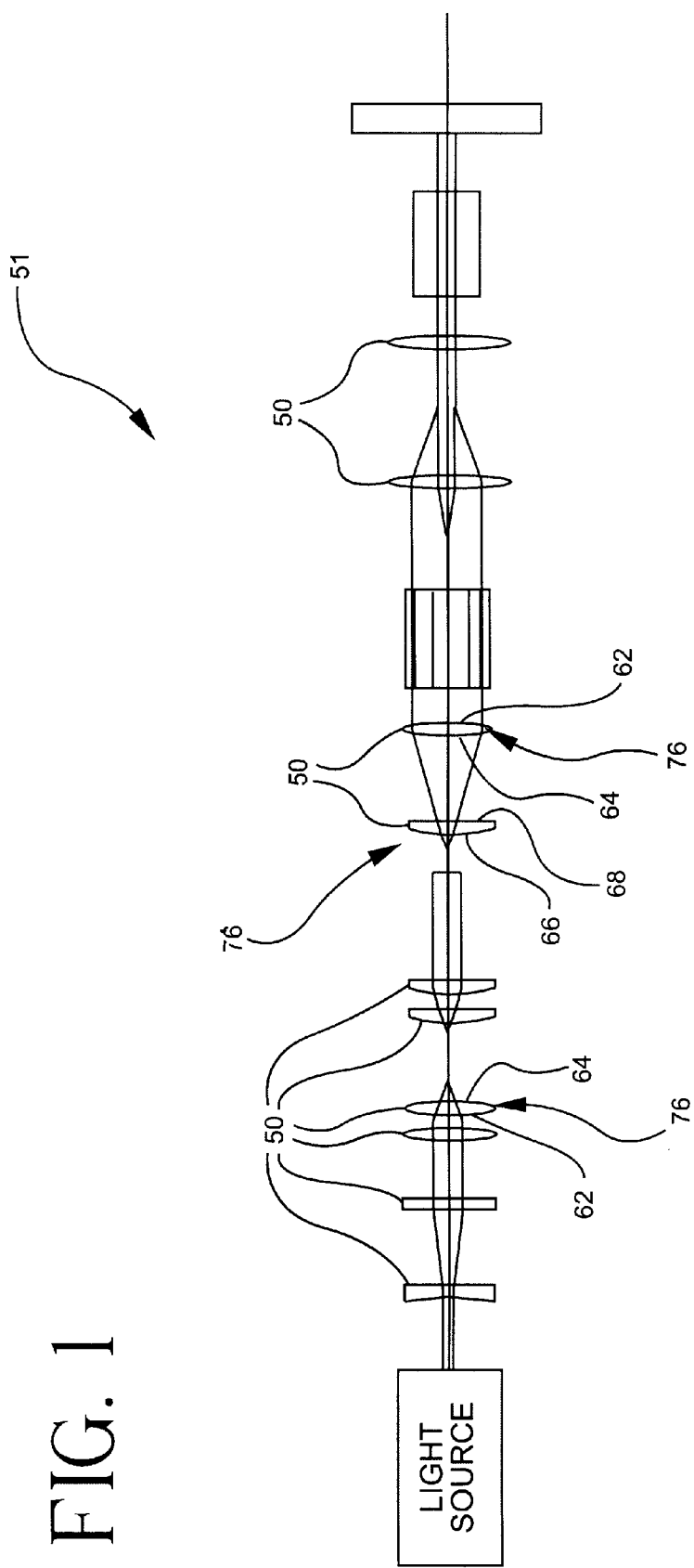
FIG. 1 shows embodiments of the invention in a lithography system/process.
Figure 2:
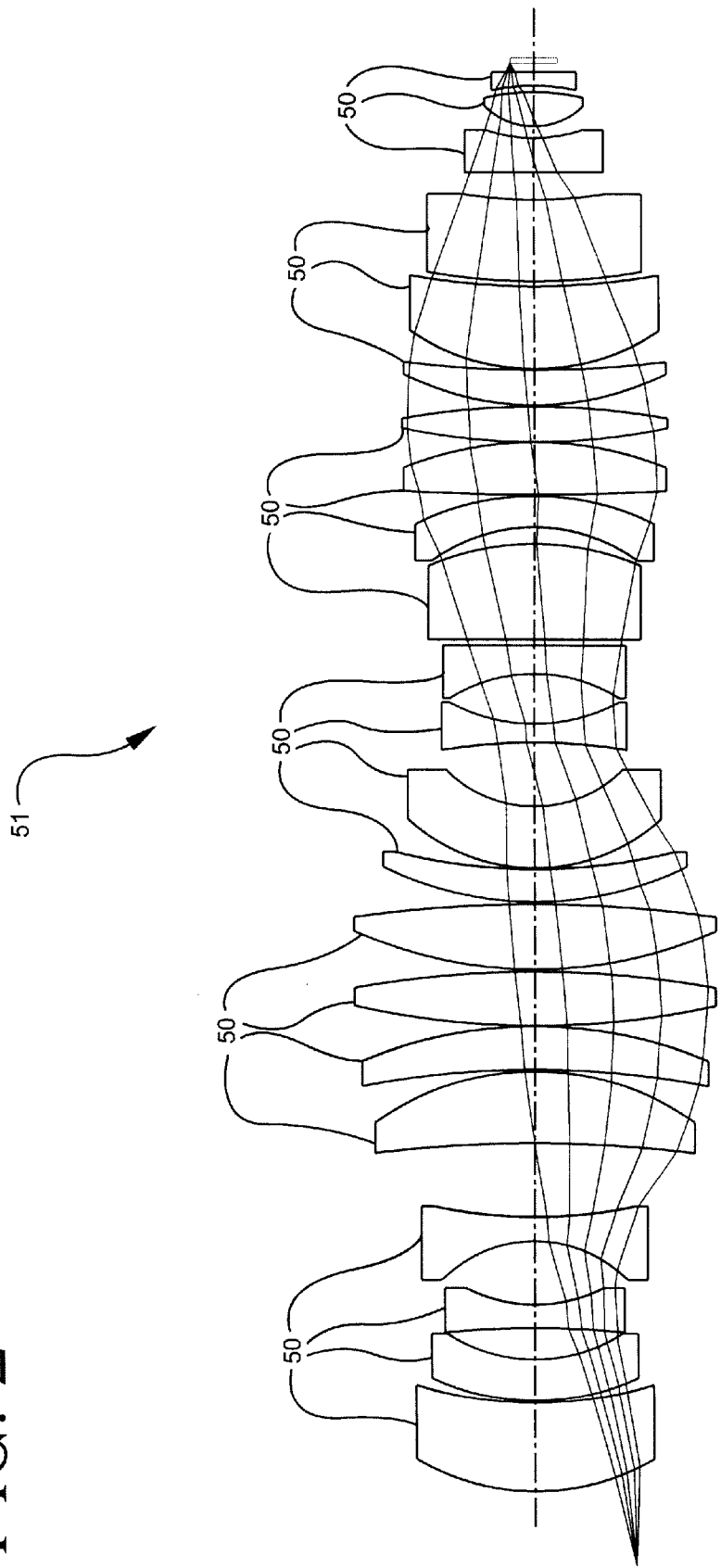
FIGS. 2–2H show embodiments of the invention in a lithography system/process with cross sectional views.
Figure 2A:
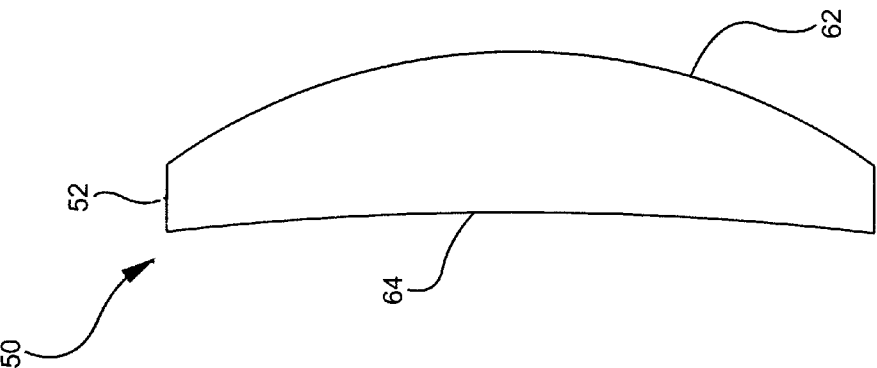
Figure 2B:
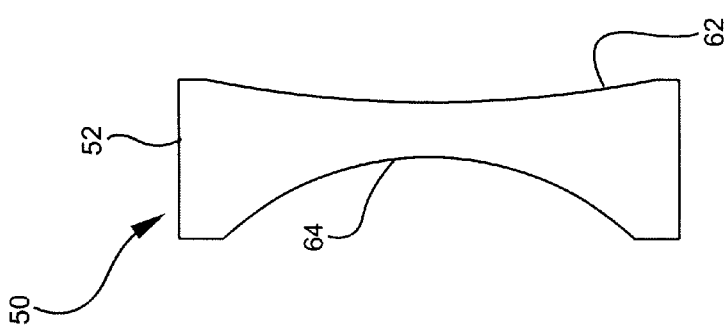
Figure 2C:
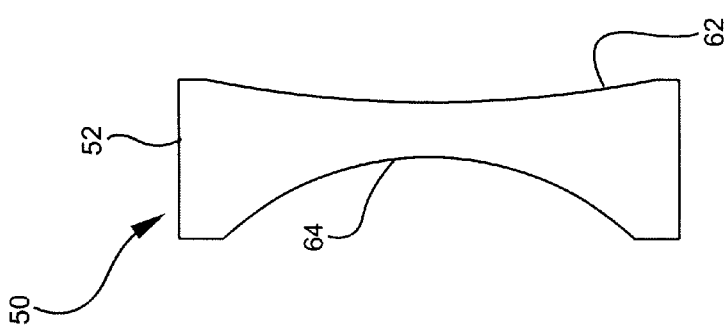
Figure 2D:
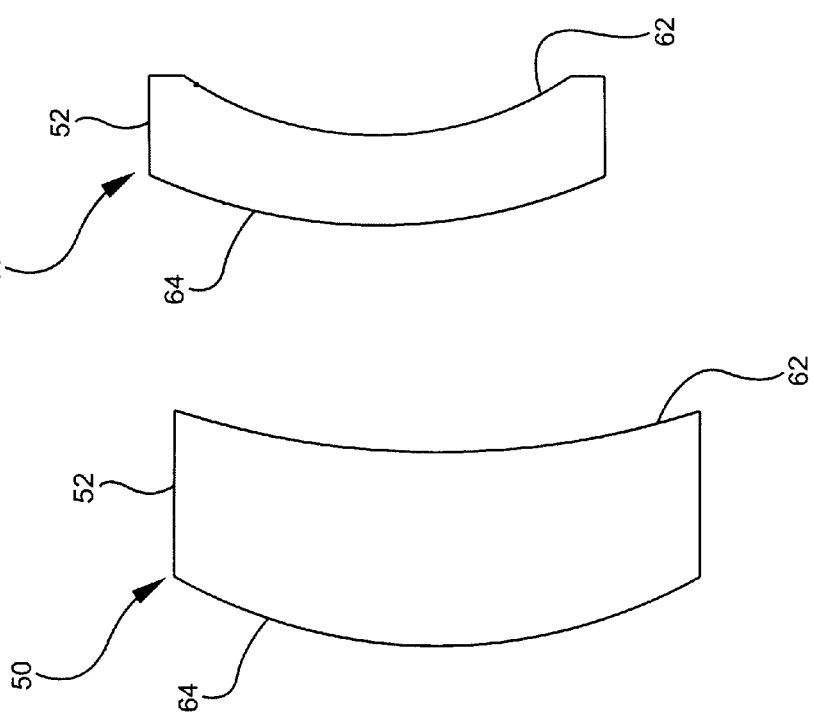
Figure 3:
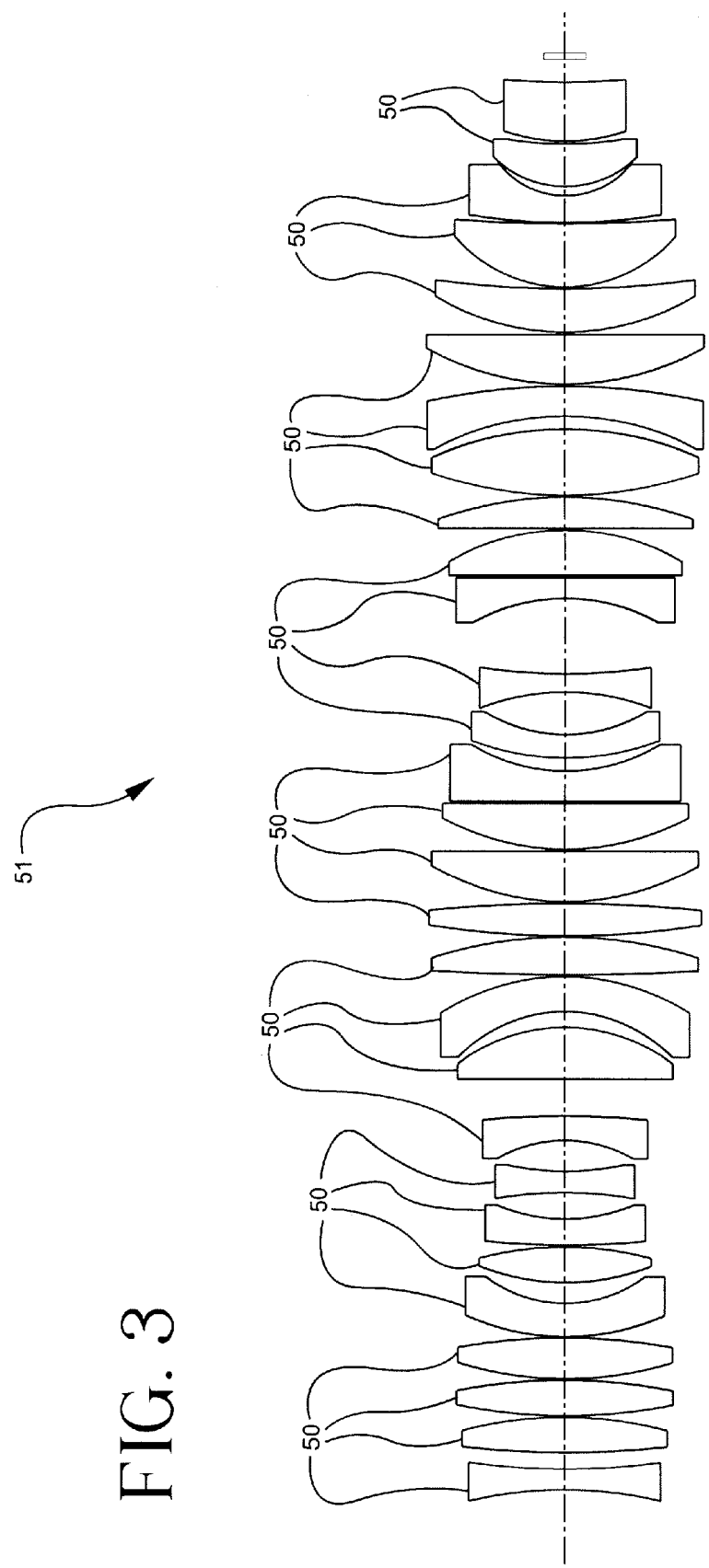
FIGS. 3–3G show embodiments of the invention in a lithogaphy system/process with cross sectional views.
Figure 3D:
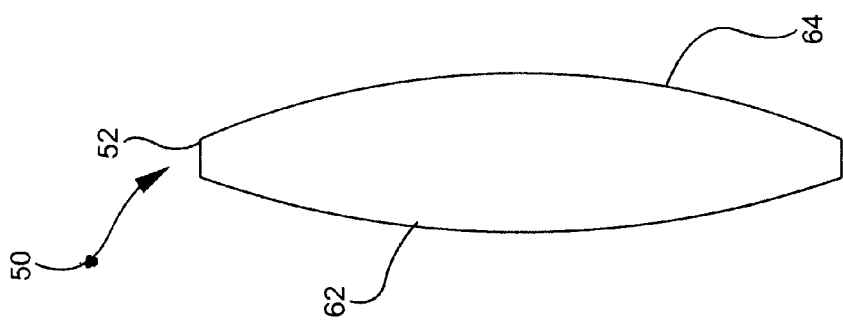
Figure 3C:
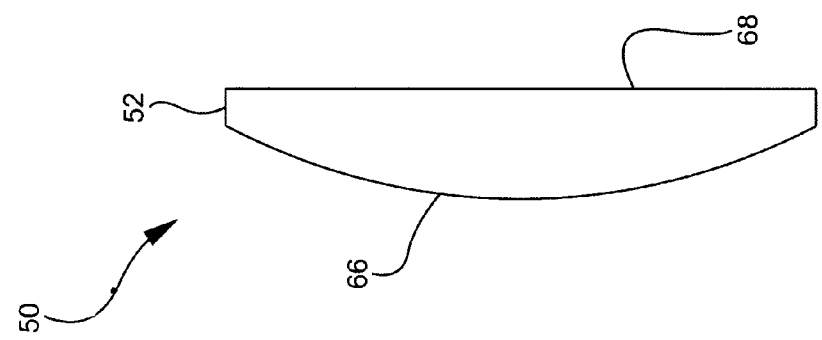
Figure 3B:
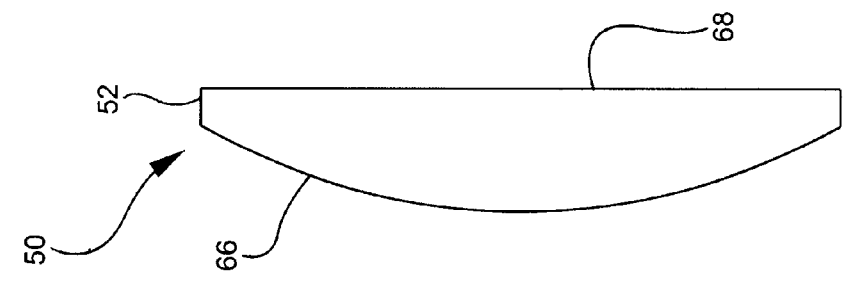
Figure 3A:
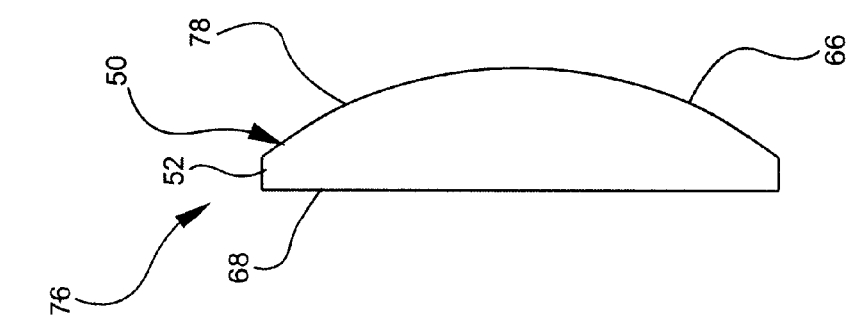

The invention includes a birefringence minimizing fluoride crystal VWV lithography lens comprised of a fluoride crystal. As shown in FIGS. 1, 2 and 3, fluoride crystal VUV lithography lens are utilized in VUV microlithography systems/processes 51 which preferably utilize VUV wavelengths of light <200 nm. The fluoride crystal lens elements are utilized in the microlithography systems including the optics which make up the illumination system, preferably including the light source (which is preferably an excimer laser), and the projection system.

Figure 5:
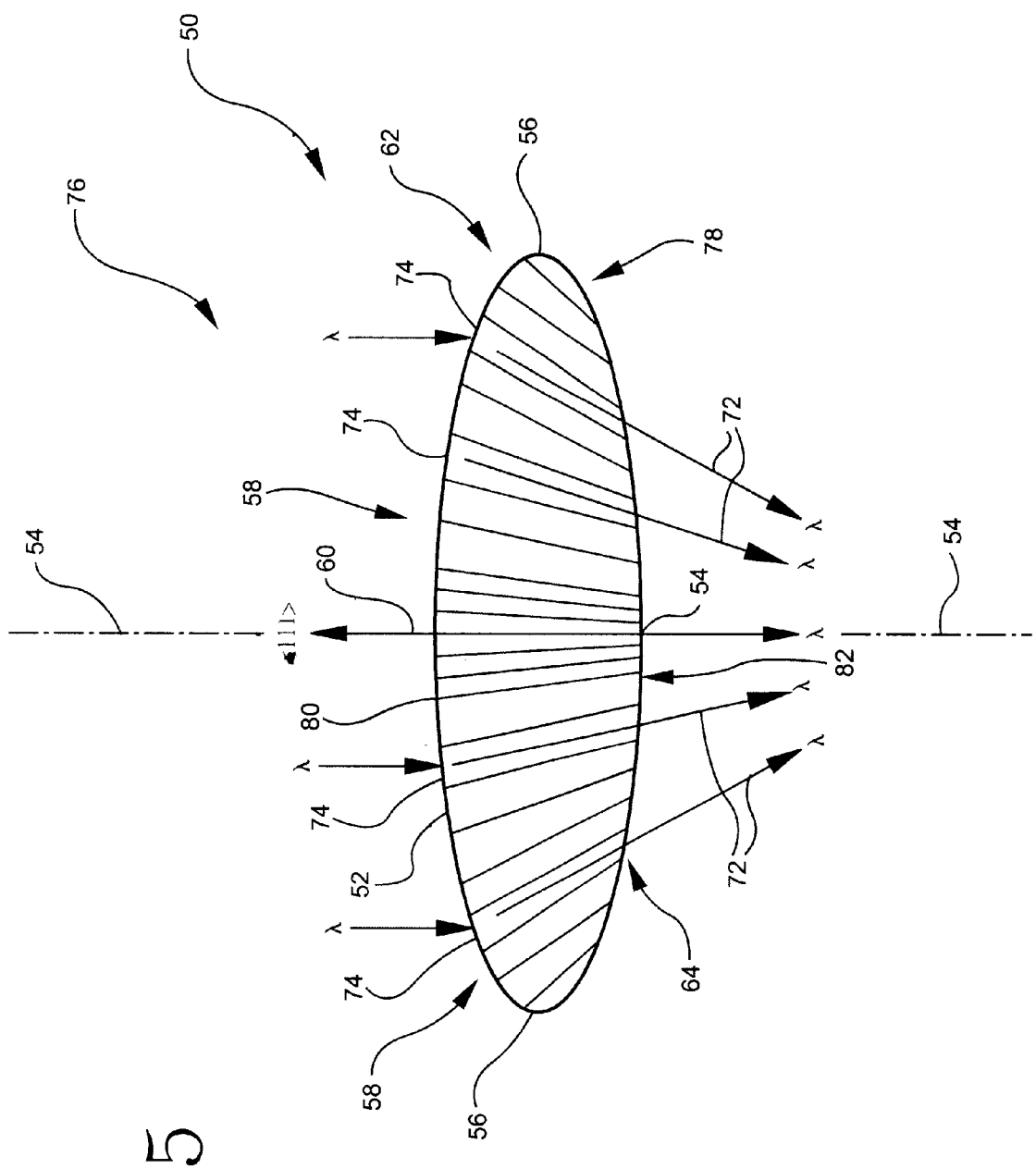
FIGS. 5–5a shows cross sectional views of embodiments of the invention.
Figure 5A:
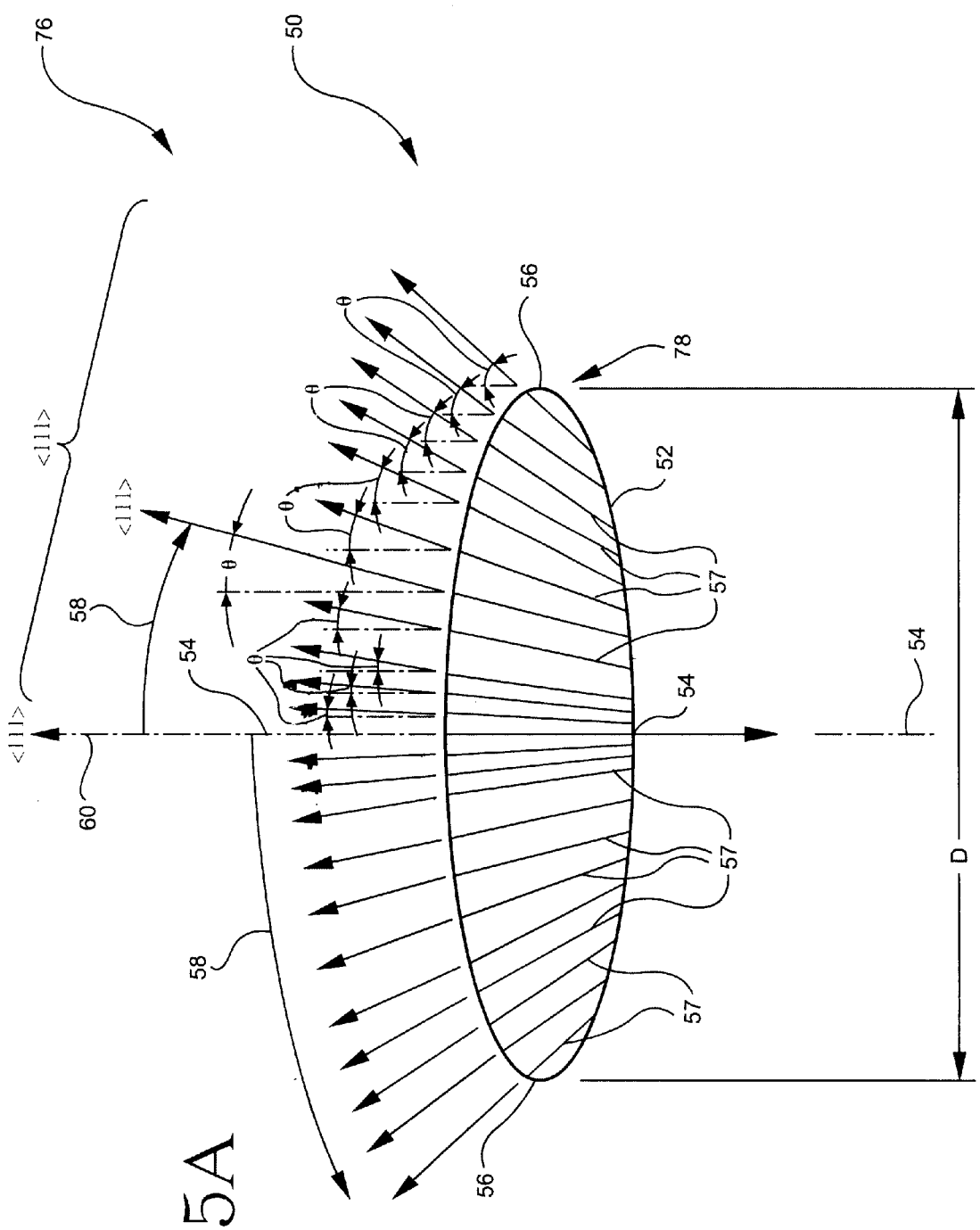
Figure 7:
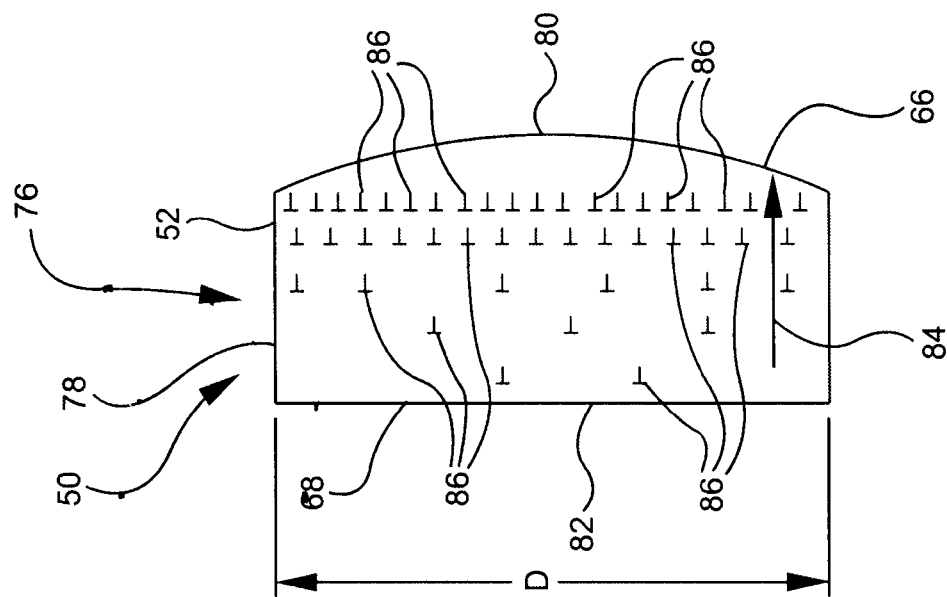
FIGS. 7–7a shows a cross sectional view of an embodiment of the invention including a progressive concentration of crystal dislocation defects and variation in <111>.
Figure 7A:
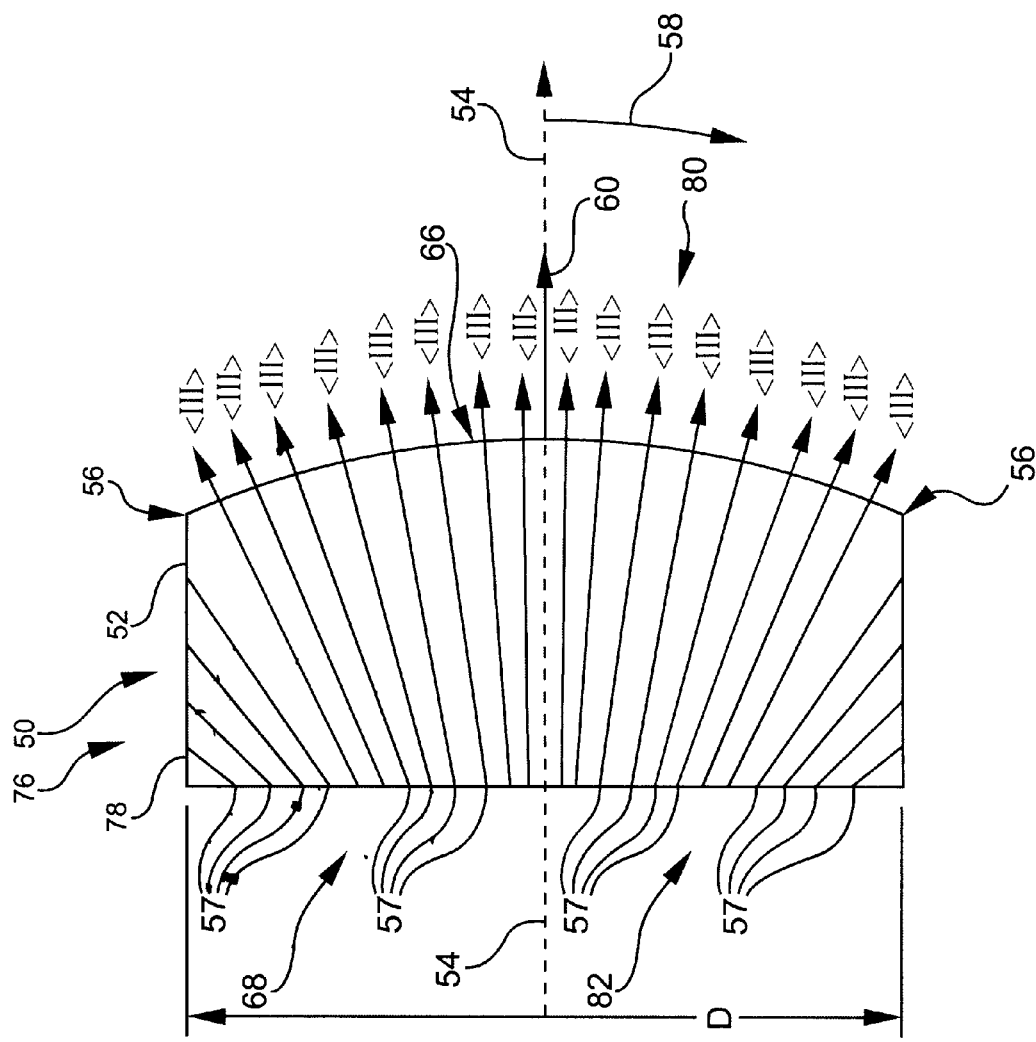

The fluoride crystal optical lithography lens 50 is comprised of a fluoride crystal 52, preferably a single crystal. As shown in FIG. 5, fluoride crystal optical lens 50 has an optical center axis 54 which is encompassed by a fluoride crystal lens perimeter 56. Fluoride lens 50 has a variation 58 in crystallographic orientation direction which tilts away from an optical center axis <111> direction orientation 60 towards perimeter 56. As shown in FIGS. 5a and 7a the <111> crystallographic orientations 57 tilt away from optical center axis <111> direction orientation 60 and spread out towards perimeter 56.

Figure 4:
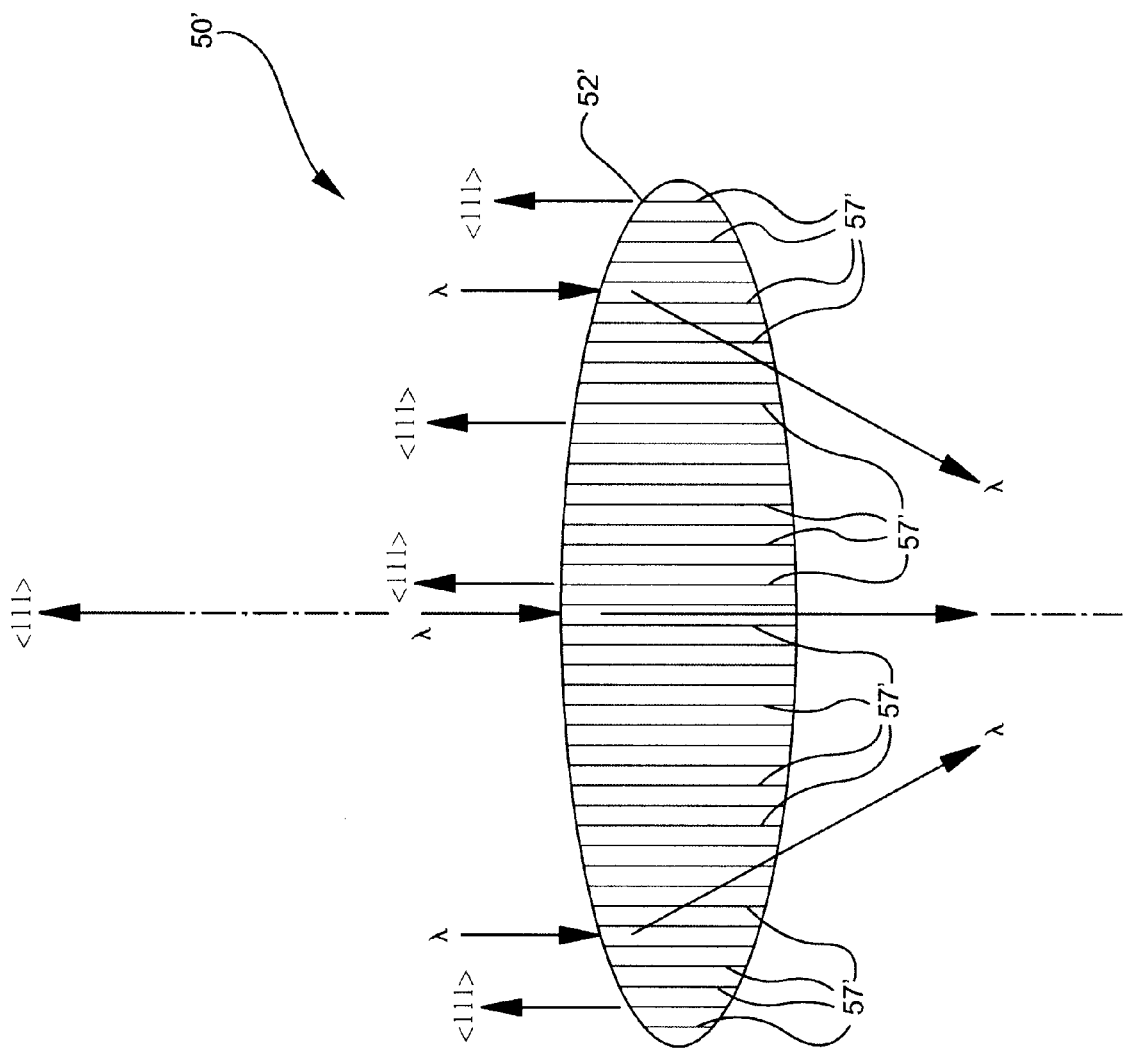
FIG. 4 shows a cross sectional view of a calcium fluoride crystal lens element with an oriented uniform <111> crystallographic orientation direction with light passing through the outer perimeter of the lens having a light path that is not parallel to the <111>.

In contrast to a variation in crystallographic orientation direction, lens 50' of FIG. 4 is comprised of a fluoride crystal 52' with an oriented uniformity in <111> crystallographic orientation directions 57' which are parallel throughout the crystal and orientated with the <111> center axis, with fluoride crystal 52' having minimal crystal dislocation defects with a minimal uniform concentration.

Figure 6:
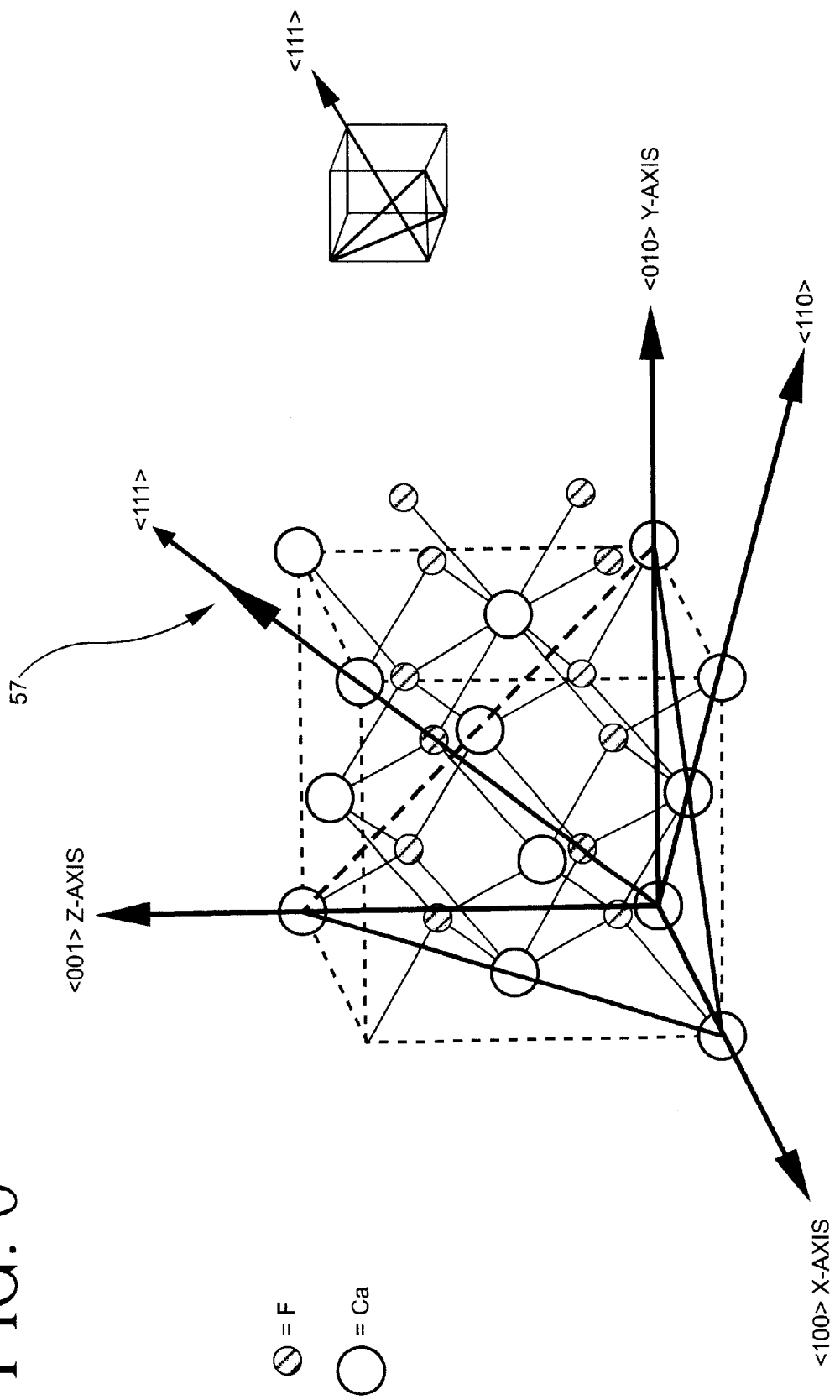
FIG. 6 shows the crystallographic orientations of a calcium fluoride crystal including the <111> crystallographic orientation direction in accordance with the invention, with the small circles representing F and the large circles representing Ca.

Preferably lens 50 is comprised of a calcium fluoride crystal 52. Preferably the calcium fluoride crystal 52 has a 157 nm internal transmission >99%/cm. Preferably the calcium fluoride crystal has a 193 nm internal transmission >99%/cm. FIG. 6 shows a calcium fluoride crystal with the calcium fluoride <111> crystallographic orientation direction 57. The <111> is perpendicular to the corresponding calcium fluoride (111) plane.

Preferably fluoride crystal optical lithography lens 50 has a first curved optical surface 62 and a second curved optical surface 64 for manipulating lithography light, preferably lithography light λ<200 nm. In a preferred alternative fluoride crystal optical lithography lens 50 has a curved optical surface 66 and a planar optical surface 68.

Preferably the variation in crystallographic orientation 58 is in the range from about 2 to 15 degrees, preferably from 3 to 12, and most preferably 5 to 10 degrees. As shown in FIGS. 5a and 7a the variation in <111> orientation tilts away from the optical center axis 54 <111> direction orientation 60 and towards lens perimeters 56. Preferably the crystal disorientation θ progresses from the center axis with $0<\theta_2<\theta_3<\theta_4<\theta_5<\theta_6<\theta_7 \ldots <\theta_n$.

Preferably fluoride crystal optical lithography lens 50 has nonparallel light ray paths 72 and fluoride crystal 52 has nonparallel <111> crystal paths 74 in alignment with the lens light ray paths 72. The crystallographic orientation direction <111> crystal paths 74 are aligned with the light ray paths 72 that lens 50 is designed to manipulate. Preferably lens 50 and crystal paths 74 are utilized to coverage or diverge an incident light beam comprised of light rays.

Figure 8:
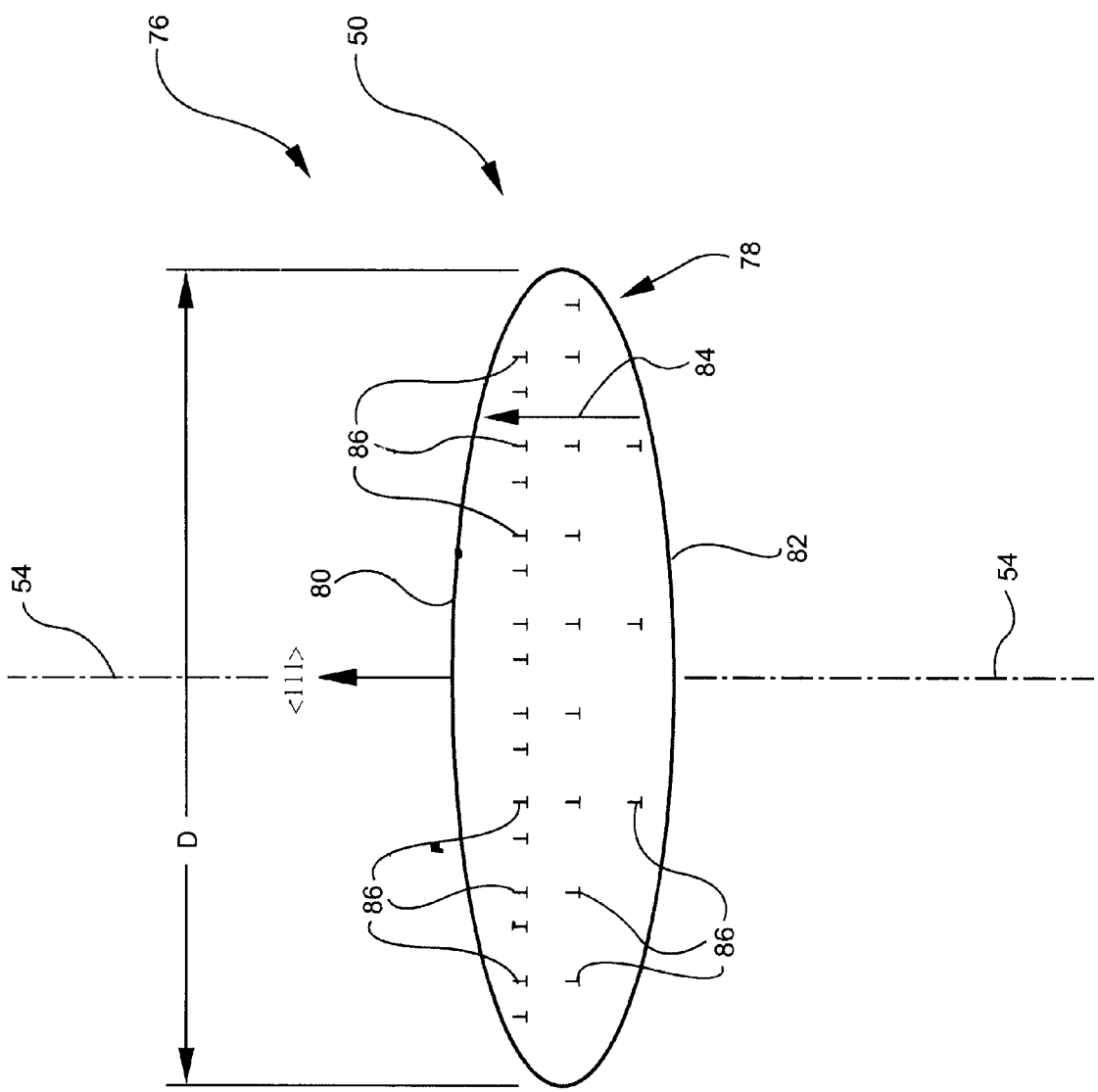
FIG. 8 shows a cross sectional view of an embodiment of the invention including a progressive concentration of crystal dislocation defects.

The invention further includes a fluoride crystal optical lens 76 comprised of a single fluoride crystal 78. The fluoride crystal 78 has a first optical lens surface 80 and a separated second optical lens surface 82 which opposes the first. Fluoride crystal 78 has a progressive concentration 84 of crystal dislocation defects 86 that increase from the second optical surface 82 toward the first optical lens surface 80. As shown in FIGS. 7–8, the concentration of crystal dislocation defects is a progressive concentration represented by the arrow 84 with the concentration of defects 86 preferably increasing from the second surface 82 to the first 80. In a preferred embodiment the first optical lens surface is a curved lens surface and the second optical lens surface is a curved lens surface. In an alternative embodiment the first optical lens surface is a flat optical surface. In an alternative embodiment the second optical lens surface is a flat optical surface. Preferably lens 76 has an optical center axis 54 aligned with the local <111> direction. In a preferred embodiment the single fluoride crystal 78 is calcium fluoride, preferably with a 193 nm internal transmission >99%/cm and a 157 nm internal transmission >99%/cm.

The invention further includes a calcium fluoride crystal optical element for manipulating a transmitting wavelength λ<200 nm. The less than 200 nm wavelength optical element 76 is comprised of a calcium fluoride crystal 78. The calcium fluoride crystal has a first optical surface 80 and a second optical surface 82 for manipulating λ. The calcium fluoride crystal has a concentration 84 of crystal dislocation defects 86 that increases from the second optical surface to the first optical surface. The first optical surface has a first surface subgrain boundary length per unit area in the range from about 10 to 50 cm/cm². The second optical surface has a second surface subgrain boundary length per unit area less than 10 cm/cm². The element 76 has a large dimension D. Preferably D is greater than 100 mm, more preferably ≧150 mm, more preferably ≧200 mm, more preferably ≧250 mm, and most preferably ≧300. In a preferred embodiment the first optical surface is a curved lens surface. In a preferred embodiment the second optical surface is a curved lens surface. In an alternative embodiment an optical surface is a flat optical surface. In a preferred embodiment λ is centered about 193 nm and the calcium fluoride crystal has a 193 nm internal transmission >99%/cm. In a further embodiment λ is centered about 157 nm and the calcium fluoride crystal has a 157 nm internal transmission >99%/cm. Preferably optical element 76 has a calcium fluoride crystal variation 58 in <111>crystallographic orientation that tilts away and spreads out from a <111> optical axis. Preferably the variation is at least three degrees, and more preferably at least five degrees.

Figure 9:
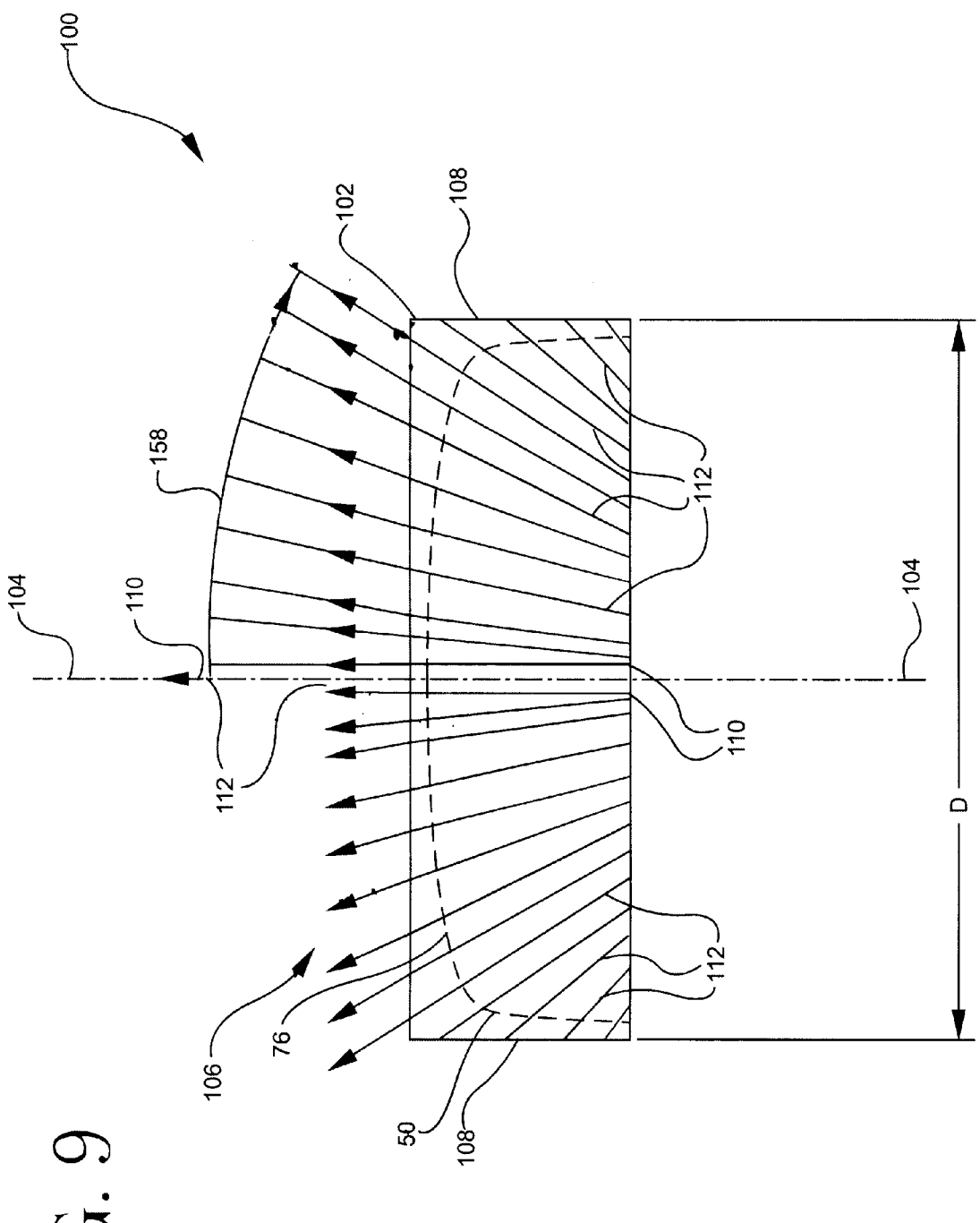
FIGS. 9–9a shows a cross sectional view of embodiments of the invention.
Figure 9A:
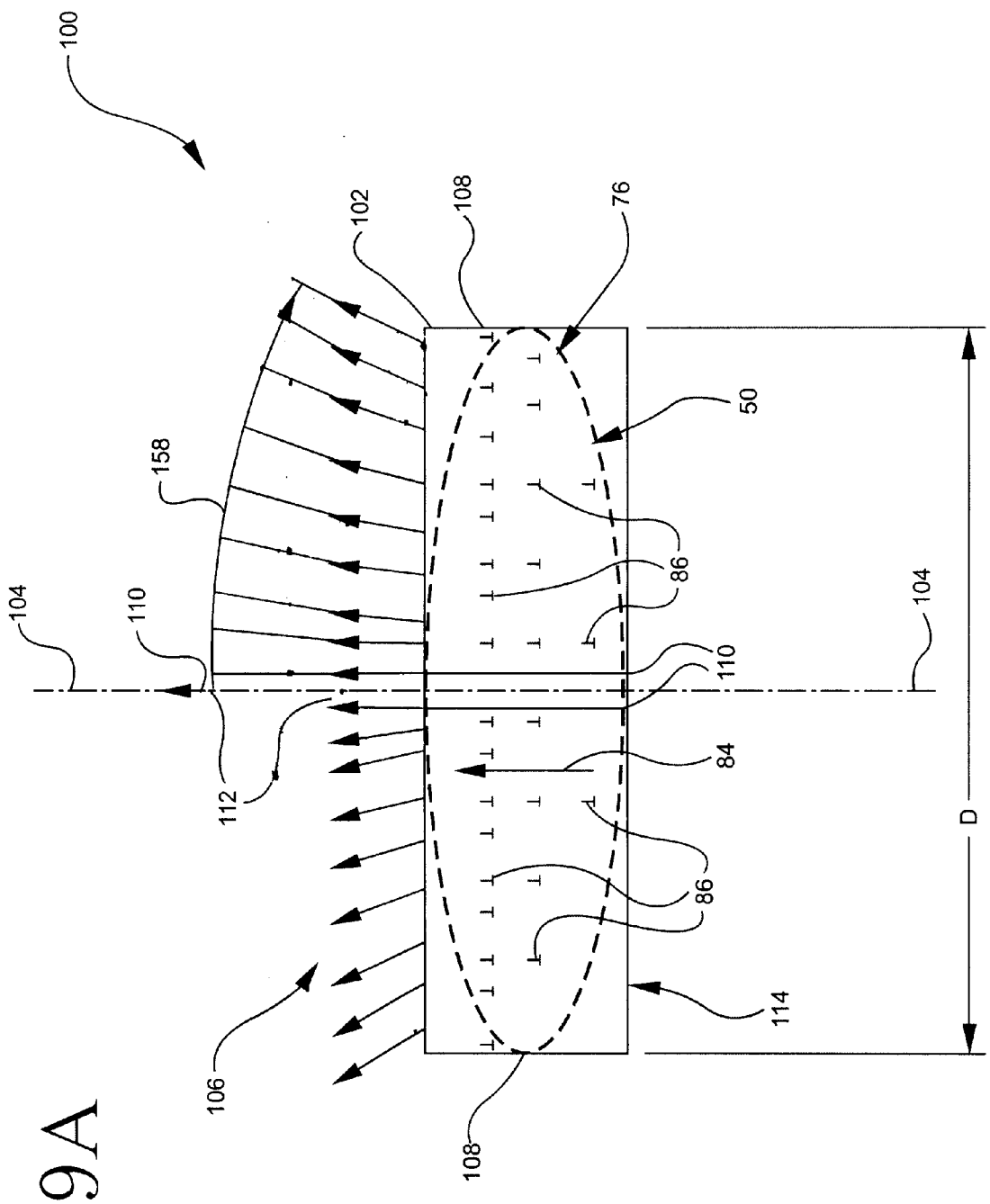
Figure 10:
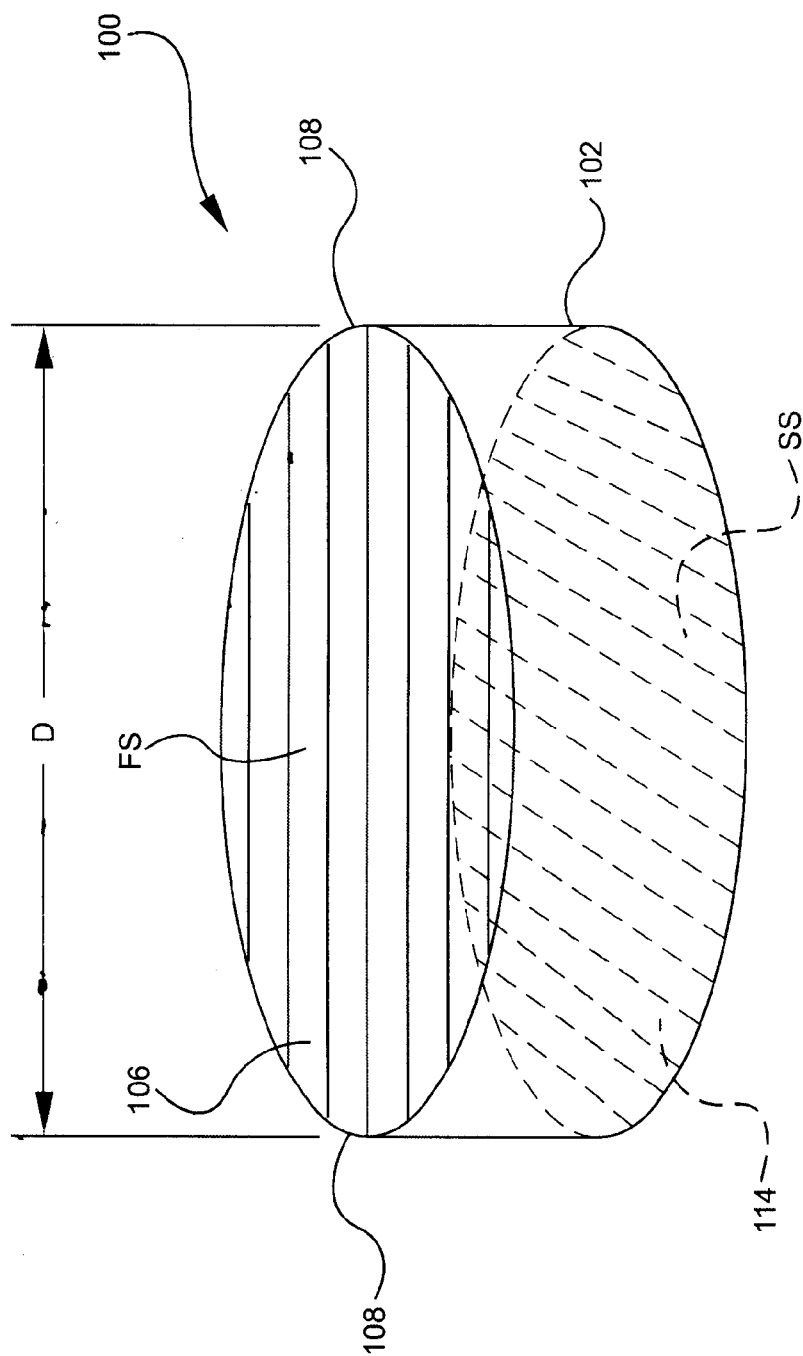
FIG. 10 shows an embodiment of the invention.
Figure 11:
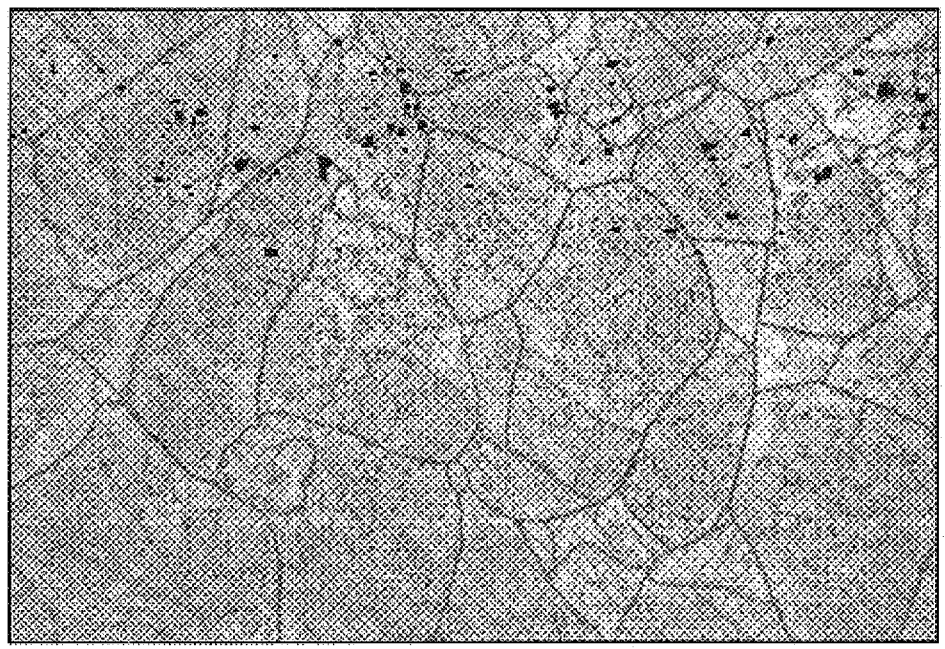
FIG. 11 is a photomicrograph of a calcium fluoride crystal surface.
Figure 12:
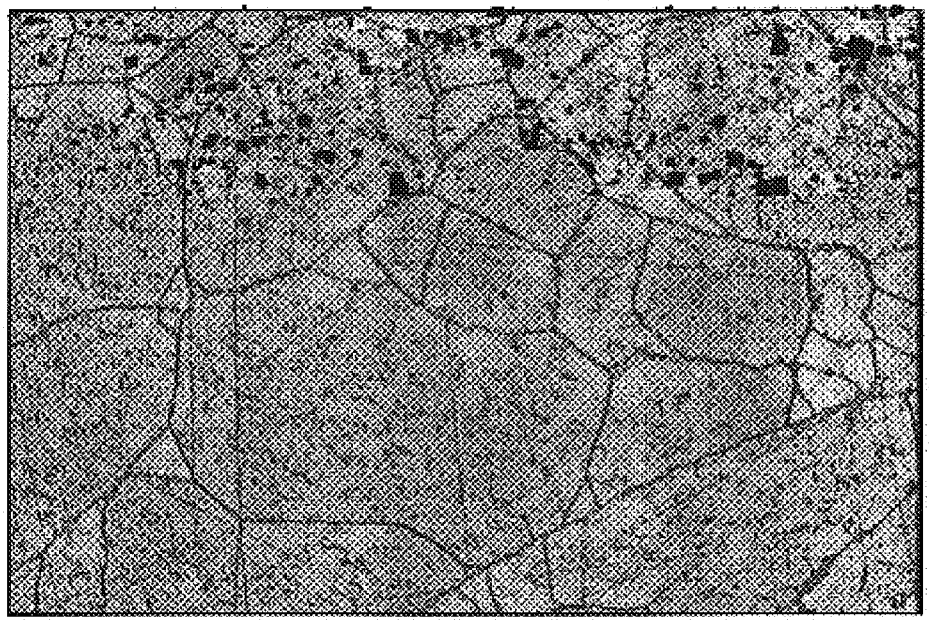
FIG. 12 is a photomicrograph of a calcium fluoride crystal surface.

The invention further includes a fluoride crystal lens blank. Fluoride crystal lens blank 100 is comprised of fluoride crystal 102. Fluoride crystal 102 has a center axis 104 through a large dimension D surface 106. Center axis 104 and surface 106 are encompassed by blank perimeter 108. Center axis 104 is aligned with and coincides with an optically preferred crystallographic direction 110. Fluoride crystal blank 100 has a variation 158 in crystallographic orientation direction 112 which spreads out from and tilts away from center axis 104 and toward blank perimeter 108. Preferably fluoride crystal 102 is calcium fluoride. With calcium fluoride lens blank 100 the optically preferred crystal direction 110 is the calcium fluoride direction <111>. Preferably calcium fluoride crystal 102 has a 193 nm internal transmission >99%/cm. Preferably the large dimension D of fluoride crystal lens blank 100 is ≧100mm, more preferably D ≧150mm, more preferably ≧200mm, more preferably ≧250mm, and most preferably D ≧300mm. Preferably the variation 158 is crystallographic orientations 112 is in the range from about 2 to 15 degrees, more preferably 3 to 12 degrees, and most preferably 5 to 10 degrees. With a calcium fluoride crystal lens blank the variation 158 from the <111> center axis 104 is at least 3 degrees, and more preferably ≧5°. As shown in FIG. 9a, blank 100 for forming into an optical element lens 76, 50 (such as shown by dashed lines inside blank 100), preferably has a second surface 114 which opposes surface 106 with fluoride crystal 102 having a concentration of crystal dislocation defects 86 that increases from second surface 114 to surface 106. Preferably optical lens blank 100 as shown in FIG. 10 has a second surface 114 having a second surface subgrain boundary length per unit area SS and surface 106 having a large dimension surface subgrain boundary length per unit area FS wherein FS>SS. Preferably the second surface subgrain boundary length per unit area SS<10cm/cm², and more preferably FS is in the range from about 10 to 50 cm/cm2. FIGS. 11–12 show the subgrain boundaries of a calcium fluoride optical lens blank surface that has been acid etched. These photomicrographs are of the, calcium fluoride surface after acid etching for 15 minutes with 0.1 N Nitric acid. FIG. 12 was analyzed with quantitative optical microscopy to measure subgrain boundary characteristics including subgrain boundary length per unit area. FIG. 12 calcium fluoride optical blank surface has a subgrain boundary length per unit area of 15 cm/cm² and the average size of subgrains is about 1.8 mm in diameter.

Figure 13:
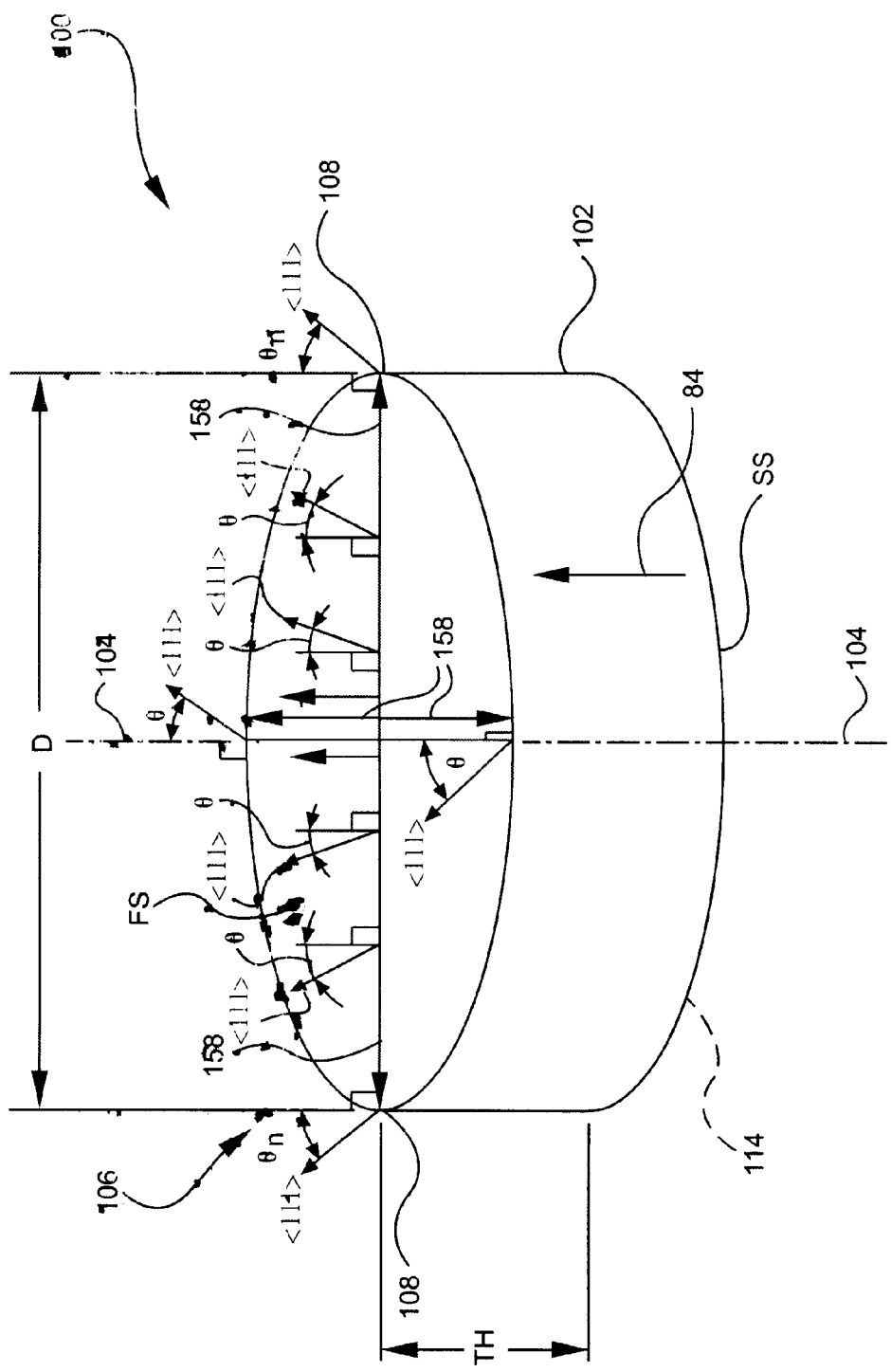
FIG. 13 shows an embodiment of the invention.

The invention further includes a birefringence minimizing fluoride crystal optical lithography lens blank. The optical element blank comprises a calcium fluoride crystal having a 193 nm internal transmission >99%/cm and a refractive index homogeneity no greater than 1 ppm. As shown in FIG. 13, calcium fluoride blank 100 has a plurality of non-parallel crystallographic <111> orientations. Blank 100 has an optical center axis 104 which coincides with the local calcium fluoride crystal <111> direction. The blank has a variation 158 in crystallographic orientation direction wherein the angular deviation θ between the center axis 104 and a non-parallel crystallographic <111> orientation at a given location having a relative location distance between the center axis 104 and the perimeter 108 correlates to the relative distance between the given location and axis 104. As shown in FIGS. 13, 9 and 9a blank 100 preferably has a first surface 106 and a second surface 114 with crystal dislocation defects 86 that increase from the second surface 114 to the first surface 106. Preferably the first and second surfaces are normal to the center axis, with blank 100 preferably in the shape form of a cylindrical disk of the appropriate size for the blank to be the perform of the optical element it is to be formed and shaped into. Preferably blank 100 has a first surface 106 and a second surface 114 with the second surface 114 having a second surface subgrain boundary length per unit area (designated by SS) <10 cm/cm² and the first surface 106 having a first surface subgrain boundary length per unit area (designated by FS)≧10 cm/cm². Preferably the first surface subgrain boundary length per unit area is in the range from about 10 to 50 cm/cm².

The invention further includes a fluoride crystal optical element blank. The blank is preferably comprised of a single fluoride crystal, most preferably a calcium fluoride crystal. Optical element blank 100 has a diameter D, a first diameter plane surface 106, a second diameter plane surface 114, and a crystal thickness TH between the first and second surfaces. Blank 100 has a concentration 84 of crystal dislocation defects 86 that increases from the second surface 114 to the first surface 106, and the second surface 114 has a second surface subgrain boundary length per unit area SS and the first surface 106 has a first surface subgrain boundary length per unit area FS wherein FS>SS. Preferably SS is less than 10 cm/cm². Preferably FS is in the range from about 10 to 50 cm/cm².

It will be apparent to those skilled in the art that various modifications and variations can be made to the present invention without departing from the spirit and scope of the invention. Thus, it is intended that the present invention cover the modifications and variations of this invention provided they come within the scope of the appended claims and their equivalents.

What is claimed is:

1. A calcium fluoride crustal optical element for manipulating a transmitting wavelength λ<200 nm, said element comprising a calcium fluoride crystal having a first optical surface and a second optical surface for manipulating λ, said calcium fluoride crystal having a concentration of crystal dislocation defects that increases from said second optical surface to said first optical surface, said first optical surface having a first surface subgrain boundary length per unit area in the range from about 10 to 50 cm/cm², said second optical surface having a second surface subgrain boundary length per unit area<10 cm/cm².

2. An optical element as claimed in claim 1, said element having a large dimension D, wherein D≧100 mm.

3. An optical element as claimed in claim 2, said calcium fluoride crystal having a variation in <111> crystallographic orientation that tilts away and spreads out from a <111> optical axis.

4. An optical element as claimed in claim 3, wherein said variation is at least three degrees.

5. An optical element as claimed in claim 3, wherein said variation is at least five degrees.

6. An optical element as claimed in claim 1, said element having a large dimension D, wherein D≧150 mm.

7. An optical element as claimed in claim 1, said element having a large dimension D, wherein D≧200 mm.

8. An optical element as claimed in claim 1, said element having a large dimension D, wherein D≧250 mm.

9. An optical element as claimed in claim 1, said element having a large dimension D, wherein D≧300 mm.

10. An optical element as claimed in claim 1, wherein said first optical surface is a curved lens surface.

11. An optical element as claimed in claim 1, wherein said second optical surface is a curved lens surface.

12. An optical element as claimed in claim 1, wherein said wavelength λ is centered about 193 nm and said calcium fluoride crystal has a 193 nm internal transmission>99%/cm.

13. An optical element as claimed in claim 1, wherein said wavelength λ is centered about 157 nm and said calcium fluoride crystal has a 157 nm internal transmission>99%/cm.

14. A fluoride crystal lens blank, said lens blank comprising a fluoride crystal having an axis through a large dimension D surface, said axis and said large dimensions D surface encompassed by a blank perimeter, said axis aligned and coinciding with an optically preferred crystallographic direction of said fluoride crystal, said fluoride crystal lens blank having a variation in crystallographic orientation direction which spreads out from said axis and tilts away from said axis and towards said blank perimeter, wherein said lens blank has a second surface, said second surface opposing said large dimension surface, said second surface having a second surface subgrain boundary length per unit area SS and said large dimension surface having a large dimension surface subgrain boundary length per unit area FS wherein FS>SS, and wherein FS is in the range from about 10 to 50 cm/cm².

15. A lens blank as claimed in claim 14, wherein said fluoride crystal is calcium fluoride.

16. A lens blank as claimed in claim 14, wherein said large dimension D≧100 mm.

17. A lens blank as claimed in claim 14, wherein the variation in crystallographic orientation is in the range from about 2 to 15 degrees.

18. A lens blank as claimed in claim 14, said blank having a second surface, said second surface opposing said large dimension surface, said fluoride crystal having a concentration of crystal dislocation defects that increases from said second surface to said large dimension surface.

19. A lens blank as claimed in claim 14 wherein SS<10 cm/cm².

20. A birefringence minimizing fluoride crystal optical lithograph lens blank, said blank comprising a calcium fluoride crystal having a 193 nm internal transmission>99%/cm and a refractive index homogeneity≦1 ppm, and a plurality of non-parallel crystallographic <111> orientations, said blank having an optical center axis coinciding with a local calcium fluoride crystal <111> direction, said blank having a crystal perimeter and a variation in crystallographic orientation direction wherein an angular deviation between the center axis and a non-parallel crystallographic <111> orientation at a given location between said center axis and said perimeter correlates to a distance between said given location and said center axis, said angular deviation increasing as the distance from the center axis to the perimeter increases:

wherein said blank has a first surface and a second surface, said second surface having a second surface subgrain boundary length per unit area<10 cm/cm² and said first surface having a first surface subgrain boundary length per unit area≧10 cm/cm².

21. A birefringence minimizing fluoride crystal optical lithography lens blank, said bank composing a calcium fluoride crystal having a 193 nm internal transmission>99%/cm and a refractive index homogeneity≦1 ppm, and a plurality of non-parallel crystallographic <111> orientations, said blank having an optical center axis coinciding with a local calcium fluoride crystal <111> direction, said blank having a crystal perimeter and a variation in crystallographic orientation direction wherein an angular deviation between the center axis and a non-parallel crystallographic <111> orientation at a given location between said center axis and said perimeter correlates to a distance between said given location and said center axis said angular deviation increasing as the distance from the center axis to the perimeter increases:

wherein said blank has a first surface and a second surface, said first and second surfaces normal to said center axis, said second surface having a second surface subgrain boundary length per unit area<10 cm/cm² and said first surface having a first surface subgrain boundary length per unit area in the range from about 10 to 50 cm/cm².

22. A fluoride crystal optical element blank, said blank comprised of a fluoride crystal having a diameter, a first diameter plane surface, a second diameter plane surface, and a crystal thickness defined by said first and second surfaces, said blank having a concentration of crystal dislocation defects that increases from said second surface to said first surface and said second surface having a second surface subgrain boundary length per unit area SS and said first surface having a first surface subgrain boundary length per unit area FS wherein FS>SS, wherein FS is in the range of about 10 to 50 cm/cm².

23. A blank as claimed in claim 22 wherein, SS<10 cm/cm².

\* \* \* \* \*